United States Patent
Shibata

(10) Patent No.: US 6,207,982 B1
(45) Date of Patent: Mar. 27, 2001

(54) SOLID-STATE IMAGE PICKUP DEVICE CAPABLE OF HIGH-SPEED TRANSFER OF SIGNAL CHARGES IN HORIZONTAL DIRECTION

(75) Inventor: Hidenori Shibata, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/193,837

(22) Filed: Nov. 18, 1998

(30) Foreign Application Priority Data

Nov. 21, 1997 (JP) .................................................. 9-321198

(51) Int. Cl.$^7$ ........................ H01L 27/148; H01L 29/768
(52) U.S. Cl. ............................ 257/232; 257/233; 257/239
(58) Field of Search ................................... 257/231, 232, 257/233, 234, 239

(56) References Cited

U.S. PATENT DOCUMENTS

| | | | |
|---|---|---|---|
| 4,540,901 | * 9/1985 | Suzuki | 307/311 |
| 5,060,245 | * 10/1991 | Nelson | 377/60 |
| 5,365,093 | * 11/1994 | Kuno | 257/233 |
| 5,379,067 | * 1/1995 | Miura | 348/311 |
| 5,998,815 | * 12/1999 | Hirama | 257/234 |
| 6,034,366 | * 3/2000 | Yu | 250/208.1 |

FOREIGN PATENT DOCUMENTS 4-365274  12/1992  (JP) .

* cited by examiner

*Primary Examiner*—Ngân V. Ngô
(74) *Attorney, Agent, or Firm*—Finnegan, Henderson, Farabow, Garrett & Dunner, L.L.P.

(57) ABSTRACT

In a solid-state image pickup device adopting a progressive scanning system, a plurality of light-receiving sections are arranged in matrix, and signal charge transfer sections including a pair of horizontal transfer sections are provided so as to correspond to the light-receiving sections in each of rows. The signal charge transfer sections are selectively driven for each of the rows, and the signal charges of the odd-numbered light-receiving sections are transferred by one of the paired horizontal transfer sections, while those of the even-numbered light-receiving sections are transferred by the other horizontal transfer section. The device is thus constituted in such a manner that the signal charges of all the light-receiving sections are transferred in the horizontal direction using two horizontal transfer sections in each of the rows. Thus, smear characteristics can greatly be improved and low power consumption can easily be achieved.

10 Claims, 4 Drawing Sheets

SOLID-STATE IMAGE PICKUP DEVICE CAPABLE OF HIGH-SPEED TRANSFER OF SIGNAL CHARGES IN HORIZONTAL DIRECTION

BACKGROUND OF THE INVENTION

The present invention relates to a solid-state image pickup device capable of high-speed transfer of signal charges in a horizontal direction and, more specifically, to a CCD (charge-coupled device) for use in an electronic still (digital still) camera and a PC (personal computer) camera which adopts a progressive scanning system.

A solid-state image pickup device, which has recently been used a lot, has the advantages that it is smaller, lighter and longer in lifetime than an image pickup tube. In particular, an interline transfer CCD (hereinafter referred to as IT-CCD) is used widely in a video camera for household use, a hand-held camera for broadcast use, etc. A digital still camera employs a CCD of a progressive scanning system capable of outputting signals of all pixels independently. This CCD needs to decrease in smear when no mechanical shutter is used and to increase the area of a chip corresponding to a film. In other words, the number of transfer stages of vertical transfer sections has to be made twice as large as that of a conventional CCD in order to realize the progressive scanning type CCD. For example, in a progressive scanning type IT-CCD, the existent two-layer-electrode/four-phase-driving can be changed to a three-layer electrode/three-phase driving in order to double the number of transfer stages of the vertical transfer sections. In this case, however, the structure of the CCD is complicated. Moreover, the number of transfer stages can be doubled by forming a wire so as to cross the center of light-receiving sections and two-layer-electrode/four-phase-drive the CCD; however, in this case, the sensitivity of the CCD is lowered.

In contrast, a frame transfer CCD (hereinafter referred to as FT-CCD) allows progressive scanning to be easily obtained by two-layer-electrode/four-phase-driving. However, an influence of smear becomes serious without using any mechanical shutter.

Furthermore, in the IT-CCD and FT-CCD, if the area of a chip or the number of pixels is increased, the capacity of transfer electrodes is increased and so is the power consumption of driving circuits.

BRIEF SUMMARY OF THE INVENTION

It is accordingly an object of the present invention to provide a solid-state image pickup device capable of greatly improving in smear characteristics and easily decreasing in power consumption.

To attain the above object, there is provided a solid-state image pickup device comprising a plurality of light-receiving sections arranged in matrix on a semiconductor substrate, a plurality of signal charge transfer sections each including a pair of horizontal transfer sections and corresponding to the light-receiving sections in a row direction, a driving section for driving each of the pairs of horizontal transfer sections of the signal charge transfer sections and selectively transferring signal charges of the light-receiving sections in the row direction by the horizontal transfer sections, and an output section for time-sequentially outputting the signal charges of the light-receiving sections in the row direction, which are transferred by the horizontal transfer sections.

According to the solid-state image pickup device having the above constitution, the signal charges of the light-receiving sections corresponding to each row can be divided and transferred by a pair of horizontal transfer sections adjacent to both sides of the light-receiving sections.

In particular, when the first storage electrodes corresponding to the odd-numbered light-receiving sections of one of paired horizontal transfer sections are electrically connected to the second storage electrodes corresponding to the even-numbered light-receiving sections of the other horizontal transfer section, the object will be attained if the number of wires is one. Thus the wire can also be used as a light shielding film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2C illustrate a solid-state image pickup device according to a second embodiment of the present invention, in which FIG. 2A is a pattern plan view of a pixel section including transfer electrodes, FIG. 2B is a cross-sectional view taken along line IIB—IIB of FIG. 2A, and FIG. 2C is also a cross-sectional view taken along line IIC—IIC of FIG. 2A;

DETAILED DESCRIPTION OF THE INVENTION

Embodiments of the present invention will now be described with reference to the accompanying drawings.
(First Embodiment)

Figure 1:
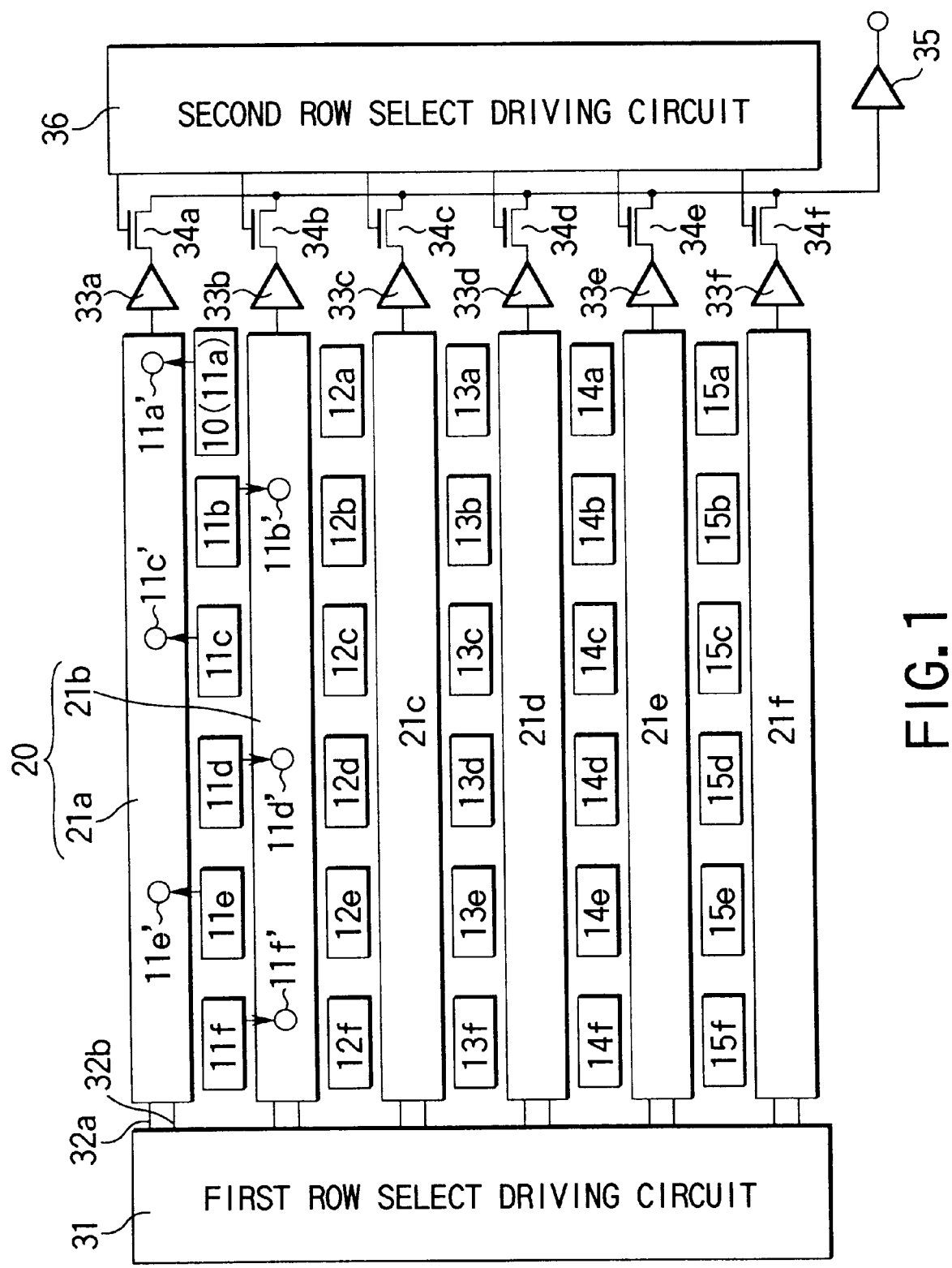
FIG. 1 is a block diagram schematically showing the constitution of a solid-state image pickup device according to a first embodiment of the present invention.

FIG. 1 illustrates the basic constitution of a solid-state image pickup device of a progressive scanning system according to a first embodiment of the present invention.

In the solid-state image pickup device illustrated in FIG. 1, a plurality of light-receiving regions 10 are arranged in matrix on a silicon substrate (not shown). In this embodiment, the number of rows is five (corresponding to the number of light-receiving regions per column) and the number of columns is six (corresponding to the number of light-receiving regions per row) and there are thirty light-receiving regions in total (11a to 11f of the first row, 12a to 12f of the second row, 13a to 13f of the third row, 14a to 14f of the fourth row, and 15a to 15f of the fifth row).

Signal charge transfer sections 20 each constituted of a CCD are provided in the first to fifth rows of light-receiving sections 11*a* to 11*f*, 12*a* to 12*f*, 13*a* to 13*f*, 14*a* to 14*f*, and 15*a* to 15*f*. Each of the signal charge transfer sections 20 is constituted of a pair of horizontal transfer sections (21*a* and 21*b* for the light-receiving sections of the first row, 21*b* and 21*c* for those of the second row, 21*c* and 21*d* for those of the third row, 21*d* and 21*e* for those of the third row, 21*d* and 21*e* for those of the fourth row, and 21*e* and 21*f* for those of the fifth row).

In other words, the first to fifth rows of the light-receiving sections are each interposed between the horizontal transfer sections 21*a* to 21*f* constitute the signal charge transfer sections 20. The paired horizontal transfer sections 21*a* and 21*b*, which are arranged in parallel with the light-receiving sections 11*a* to 11*f* of the first row, constitute the signal charge transfer section 20 for transferring signal charges of the light-receiving sections 11*a* to 11*f* in the horizontal direction. Signal charges 11*a*′, 11*c*′ and 11*e*′ of the odd-numbered light-receiving sections 11*a*, 11*c* and 11*e* are transferred by one (21*a*) of the horizontal transfer sections, while signal charges 11*b*′, 11*d*′ and 11*f*′ of the even-numbered light-receiving sections 11*b*, 11*d* and 11*f* are transferred by the other horizontal transfer section 21*b*.

Similarly, the paired horizontal transfer sections 21*b* and 21*c*, which are arranged in parallel with the light-receiving sections 12*a* to 12*f* of the second row, constitute the signal charge transfer section 20 for transferring signal charges of the light-receiving sections 12*a* to 12*f* in the horizontal direction. In the first embodiment, the other horizontal transfer section 21*b* of the signal charge transfer section 20 corresponding to the light-receiving sections 11*a* to 11*f* of the first row, is also used as one of the horizontal transfer sections 21*b* of the signal charge transfer section 20 corresponding to the light-receiving sections 12*a* to 12*f* of the second row. Of the signal charges of the light-receiving sections 12*a* to 12*f*, those of the odd-numbered light-receiving sections 12*a*, 12*c* and 12*e* are transferred by one (21*b*) of the horizontal transfer sections, while those of the even-numbered light-receiving sections 12*b*, 12*d* and 12*f* are transferred by the other horizontal transfer sections 21*c*.

Similarly, the paired horizontal transfer sections 21*c* and 21*d*, which are arranged in parallel with the light-receiving sections 13*a* to 13*f* of the third row, constitute the signal charge transfer section 20 for transferring signal charges of the light-receiving sections 13*a* to 13*f* in the horizontal direction. In this embodiment, the other horizontal transfer section 21*c* of the signal charge transfer section 20 corresponding to the light-receiving sections 12*a* to 12*f* of the second row, is also used as one of the horizontal transfer sections 21*c* of the signal charge transfer section 20 corresponding to the light-receiving sections 13*a* to 13*f* of the third row. Of the signal charges of the light-receiving sections 13*a* to 13*f*, those of the odd-numbered light-receiving sections 13*a*, 13*c* and 13*e* are transferred by one (21*c*) of the horizontal transfer sections, while those of the even-numbered light-receiving sections 13*b*, 13*d* and 13*f* are transferred by the other horizontal transfer sections 21*d*.

Similarly, the paired horizontal transfer sections 21*d* and 21*e*, which are arranged in parallel with the light-receiving sections 14*a* to 14*f* of the fourth row, constitute the signal charge transfer section 20 for transferring signal charges of the light-receiving sections 14*a* to 14*f* in the horizontal direction. In this embodiment, the other horizontal transfer section 21*d* of the signal charge transfer section 20 corresponding to the light-receiving sections 13*a* to 13*f* of the third row, is also used as one of the horizontal transfer sections 21*d* of the signal charge transfer section 20 corresponding to the light-receiving sections 14*a* to 14*f* of the fourth row. Of the signal charges of the light-receiving sections 14*a* to 14*f*, those of the odd-numbered light-receiving sections 14*a*, 14*c* and 14*e* are transferred by one (21*d*) of the horizontal transfer sections, while those of the even-numbered light-receiving sections 14*b*, 14*d* and 14*f* are transferred by the other horizontal transfer sections 21*e*.

Similarly, the paired horizontal transfer sections 21*e* and 21*f*, which are arranged in parallel with the light-receiving sections 15*a* to 15*f* of the fifth row, constitute the signal charge transfer section 20 for transferring signal charges of the light-receiving sections 15*a* to 15*f* in the horizontal direction. In this embodiment, the other horizontal transfer section 21*e* of the signal charge transfer section 20 corresponding to the light-receiving sections 14*a* to 14*f* of the fourth row, is also used as one of the horizontal transfer sections 21*e* of the signal charge transfer section 20 corresponding to the light-receiving sections 15*a* to 15*f* of the fifth row. Of the signal charges of the light-receiving sections 15*a* to 15*f*, those of the odd-numbered light-receiving sections 15*a*, 15*c* and 15*e* are transferred by one of the horizontal transfer sections 21*e*, while those of the even-numbered light-receiving sections 15*b*, 15*d* and 15*f* are transferred by the other horizontal transfer sections 21*f*.

A first row select driving circuit 31 is connected to one end of each of the signal charge transfer sections 20 in order to selectively apply a driving pulse to each of the horizontal transfer sections 21*a* to 21*f*. More specifically, the circuit 31 is connected to even- and odd-numbered transfer electrodes (not shown) in the horizontal transfer sections 21*a* to 21*f* by means of driving wires 32*a* and 32*b* to two-phase-drive the sections 21*a* to 21*f* for every pair. For example, the odd-numbered transfer electrodes of each of the horizontal transfer sections 21*a* to 21*f* are connected to the driving wire 32*b*, and the even-numbered transfer electrodes thereof are connected to the driving wire 32*a*. In this case, some of the odd-numbered transfer electrodes also serve as gate electrodes for reading out the signal charges of the odd-numbered ones of light-receiving sections, which are adjacent to the odd-numbered transfer electrodes in the downward direction in FIG. 1, and applying them to the corresponding horizontal transfer section, and some of the even-numbered transfer electrodes also serve as gate electrodes for reading out the signal charges of the even-numbered ones of light-receiving sections, which are adjacent to the even-numbered transfer electrodes in the upward direction in FIG. 1, and applying them to the corresponding horizontal transfer section.

More specifically, the odd-numbered transfer electrodes corresponding to the light-receiving sections 11*a*, 11*c* and 11*e* are connected to the driving wire 32*b* while serving as readout gate electrodes, such that the signal charges 11*a*′, 11*c*′ and 11*e*′ of at least the odd-numbered light-receiving sections 11*a*, 11*c* and 11*e* can be read out and applied to the horizontal transfer section 21*a*. In this case, the even-numbered transfer electrodes are connected to the driving wire 32*a*, but there are no light-receiving sections adjacent to the horizontal transfer section 21*a* in the upward direction in FIG. 1. Therefore, the even-numbered transfer electrodes do not serve as readout gate electrodes.

The even-numbered transfer electrodes corresponding to the light-receiving sections 11*b*, 11*d* and 11*f* are connected to the driving wire 32*a* while serving as readout gate electrodes, such that the signal charges 11*b*′, 11*d*′ and 11*f*′ of the even-numbered light-receiving sections 11*b*, 11*d* and 11*f* can be read out and applied to the horizontal transfer section 21*b*. Moreover, the odd-numbered transfer electrodes corresponding to the light-receiving sections 12*a*, 12*c* and 12*e* are connected to the driving wire 32b while serving as readout gate electrodes, such that the signal charges of the odd-numbered light-receiving sections 12a, 12c and 12e can be read out and applied to the horizontal transfer section 21b.

Similarly, the even-numbered transfer electrodes corresponding to the light-receiving sections 12b, 12d and 12f are connected to the driving wire 32a while serving as readout gate electrodes, such that the signal charges of the even-numbered light-receiving sections 12b, 12d and 12f can be read out and applied to the horizontal transfer section 21c. Moreover, the even-numbered transfer electrodes corresponding to the light-receiving sections 13a, 13c and 13e are connected to the driving wire 32b while serving as readout gate electrodes, such that the signal charges of the odd-numbered light-receiving sections 13a, 13c and 13e can be read out and applied to the horizontal transfer section 21c.

Similarly, the even-numbered transfer electrodes corresponding to the light-receiving sections 13b, 13d and 13f are connected to the driving wire 32a while serving as readout gate electrodes, such that the signal charges of the even-numbered light-receiving sections 13b, 13d and 13f can be read out and applied to the horizontal transfer section 21d. Moreover, the odd-numbered transfer electrodes corresponding to the light-receiving sections 14a, 14c and 14e are connected to the driving wire 32b while serving as readout gate electrodes, such that the signal charges of the odd-numbered light-receiving sections 14a, 14c and 14e can be read out and applied to the horizontal transfer section 21d.

Similarly, the even-numbered transfer electrodes corresponding to the light-receiving sections 14b, 14d and 14f are connected to the driving wire 32a while serving as readout gate electrodes, such that the signal charges of the even-numbered light-receiving sections 14b, 14d and 14f can be read out and applied to the horizontal transfer section 21e. Moreover, the odd-numbered transfer electrodes corresponding to the light-receiving sections 15a, 15c and 15e are connected to the driving wire 32b while serving as readout gate electrodes, such that the signal charges of the odd-numbered light-receiving sections 15a, 15c and 15e can be read out and applied to the horizontal transfer section 21e.

The even-numbered transfer electrodes corresponding to the light-receiving sections 15b, 15d and 15f are connected to the driving wire 32a while serving as readout gate electrodes, such that the signal charges of at least the even-numbered light-receiving sections 15b, 15d and 15f can be read out and applied to the horizontal transfer section 21f. In this case, the odd-numbered transfer electrodes are connected to the driving wire 32b, but there are no light-receiving sections adjacent to the horizontal transfer section 21f in the downward direction in FIG. 1. Therefore, the odd-numbered transfer electrodes do not serve as readout gate electrodes.

Signal charge detecting sections 33a to 33f are connected to the other ends of the signal charge transfer sections 20 to detect the signal charges transferred by the horizontal transfer sections 21a to 21f. The output terminals of the sections 33a to 33f are connected to an output section 35 through their respective MOS switches 34a to 34f. The output section 35 time-sequentially outputs the signal charges transferred by the horizontal transfer sections 21a to 21f. The MOS switches 34a to 34f are turned on/off by a second row select driving circuit (e.g., shift register) 36 connected to the gates of the MOS switches 34a to 34f.

A method for driving a solid-state image pickup device so constituted, will now be described in brief.

Assume that a driving pulse for reading signal charges is applied from the first row select driving circuit 31 to the horizontal transfer sections 21a and 21b corresponding to the light-receiving sections 11a to 11f of the first row. The signal charges 11a′, 11c′ and 11e′ of the odd-numbered light-receiving sections 11a, 11c and 11e are read out by one (21a) of the horizontal transfer section, while the signal charges 11b′, 11d′ and 11f′ of the even-numbered light-receiving sections 11b, 11d and 11f are read out by the other horizontal transfer section 21b. The signal charges 11a′, 11c′ and 11e′ and the signal charges 11b′, 11d′ and 11f′ are shifted from each other only by one pixel (½ transfer stage). Thus, a driving pulse for transferring the charges is applied from the first row select driving circuit 31 to the horizontal transfer sections 21a and 21b, and the signal charges 11a′, 11c′ and 11e′ transferred by the horizontal transfer section 21a and the signal charges 11b′, 11d′ and 11f′ transferred by the horizontal transfer section 21b are detected by the signal charge detecting sections 33a and 33b in the following order: 11a′, 11b′, 11c′, 11d′, 11e′ and 11f′. Consequently, the MOS switches 34a and 34b are turned on and off alternately at a normal signal transfer frequency by the second row select driving circuit 36 (the frequency is twice as high as that of the driving pulse for transferring the charges), with the result that the signal charges 11a′, 11b′, 11c′, 11d′, 11e′ and 11f′ are output from the output section 35 in the order designated.

Similarly, in order to output the signal charges of the light-receiving sections 12a to 12f of the second row, a driving pulse for reading signal charges and that for transferring the charges are selectively applied to the horizontal transfer sections 21b and 21c. The signal charges can thus be output in time sequence.

Since the signal charges of the light-receiving sections 13a to 13f of the third row, those of the light-receiving sections 14a to 14f of the fourth row, and those of the light-receiving sections 15a to 15f of the fifth row are output in the same manner, a progressive scan driving system for outputting the signal charges of all the light-receiving regions 10 in time sequence can be achieved.

According to the foregoing solid-state image pickup device of the first embodiment of the present invention, the signal charges of the light-receiving sections of each row can be divided between the paired horizontal transfer sections adjacent to the light-receiving sections of the row, without vertical transfer whose transfer speed is low. The signal charges can thus be transferred at high speed in the horizontal direction, thus greatly reducing a smear phenomenon in which a thin band-like mark is formed so as to extend up and down on an image of a high-intensity subject. Since, moreover, the paired horizontal transfer sections, corresponding to the light-receiving sections of each row, can selectively be driven, the frequency for driving them can be half that in a solid-state image pickup device for transferring signal charges in a horizontal direction by means of one horizontal transfer section corresponding to the light-receiving sections of each row (as disclosed in, for example, Jpn. Pat. Appln. KOKAI Publication No. 4-365274). For this reason, even though the area of a chip or the number of pixels are increased, the power consumption can be decreased. Furthermore, the signal charges corresponding to the light-receiving sections of each row can be divided between a pair of horizontal transfer sections, with the result that the number of signal charges to be transferred is two times larger than that in the device of the above Publication No. 4-365274, and a larger number of signal charges can be transferred in a short time.

In the above first embodiment of the present invention, two driving wires are provided for one horizontal transfer section in order to divide the signal charges of the light-receiving sections of each row between a pair of horizontal transfer sections. The present invention is not limited to this. For example, the signal charges can be divided and transferred to a pair of horizontal transfer sections by one driving wire.

(Second Embodiment)

Figure 2A:
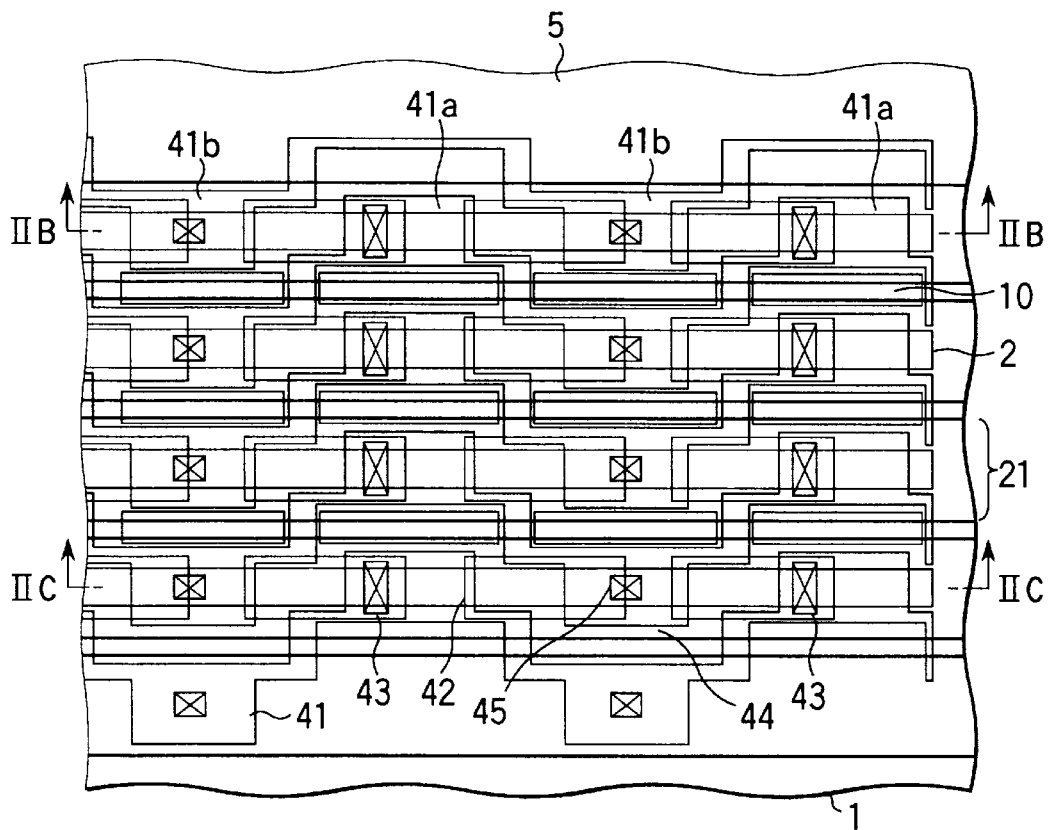
Figure 2B:
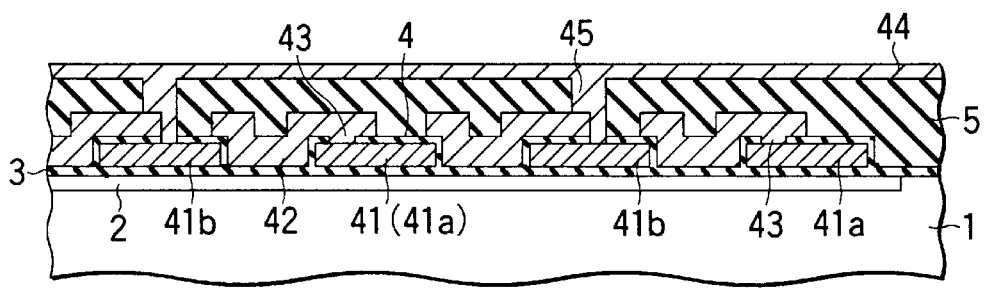
Figure 2C:
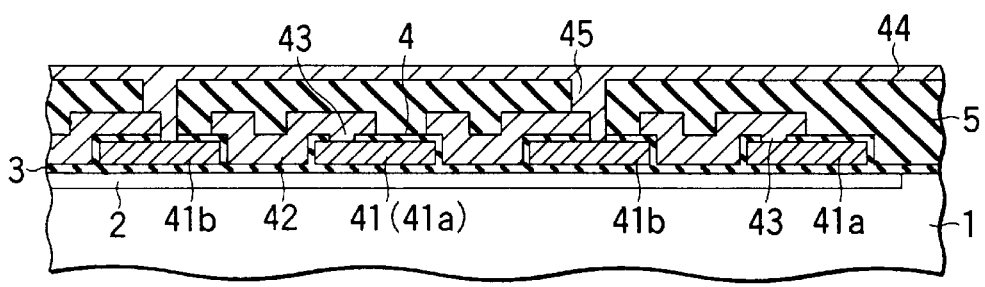

FIGS. 2A to 2C schematically shows the constitution of a solid-state image pickup device according to a second embodiment of the present invention.

The device of the second embodiment is so constituted that the signal charges of light-receiving regions of each row can be divided between paired horizontal transfer sections by allotting one driving wire to each of the horizontal transfer sections. FIG. 2A is a pattern plan view of a pixel section including transfer electrodes, FIG. 2B is a cross-sectional view taken along line B—B of FIG. 2A, and FIG. 2C is also a cross-sectional view taken along line C—C of FIG. 2A.

As shown in FIGS. 2A to 2C, transfer channels (horizontal CCD channels) 2 are formed on the surface of a silicon substrate 1 so as to correspond to light-receiving regions (e.g., photodiodes) 10 of each row. An insulation film 3 is formed on each of the transfer channels 2, and a plurality of horizontal transfer sections 21 are provided on the insulation film 3. Each of the horizontal transfer sections 21 is constituted of a plurality of transfer electrodes corresponding to the light-receiving regions 10. The transfer electrodes include storage electrodes 41 of a first polysilicon layer and barrier electrodes 42 of a second polysilicon layer each formed on an insulation film 4 and between adjacent storage electrodes 41. The storage electrodes 41 include first storage electrodes 41a corresponding to the odd-numbered light-receiving regions 10 and second storage electrodes 41b corresponding to the even-numbered light-receiving regions 10. The first storage electrodes 41a of one of paired horizontal transfer sections 21 are electrically connected to the second storage electrodes 41b of the other horizontal transfer section 21. These storage electrodes are each formed so as to meander between the light-receiving regions 10 of the respective rows. The barrier electrodes 42 are formed like islands so as to bridge a gap between the storage electrodes 41.

The storage electrodes 41(41a) and barrier electrodes 42 of each horizontal transfer section 21 of an odd-numbered row are electrically connected to each other by a contact portion 43, as illustrated in FIG. 2B. The other storage electrodes 41(41b) and barrier electrodes 42 are electrically connected to each other by both a contact portion 45 and a driving wire 44 which is formed of aluminum or the like and provided on an insulation film 5 for each of the horizontal transfer sections 21.

Similarly, the storage electrodes 41(41a) and barrier electrodes 42 of each horizontal transfer section 21 of an even-numbered row are electrically connected to each other by a contact portion 43, as illustrated in FIG. 2C. The other storage electrodes 41(41b) and barrier electrodes 42 are electrically connected to each other by both a contact portion 45a and a driving wire 44 which is formed of aluminum or the like and provided on the insulation film 5 for each of the horizontal transfer sections 21.

With the above constitution, not only the same advantage as that of the solid-state image pickup device according to the first embodiment is expected, but also the device can be simplified further. More specifically, the first storage electrodes 41a of one of the paired horizontal transfer sections 21 and the second storage electrodes 41b of the other horizontal section are connected to each other. Therefore, the signal charges of the light-receiving regions of each row can be divided between the paired horizontal transfer sections 21 adjacent to the light-receiving regions 10 by the single driving wire 44. Moreover, only one driving wire is sufficient for the purpose, and it can be also used as a light shielding film. It is thus unnecessary to form a light shielding metal layer.

A method of driving the above-described solid-state image pickup device according to the second embodiment of the present invention, will now be described with reference to FIGS. 3 and 4.

Figure 3:
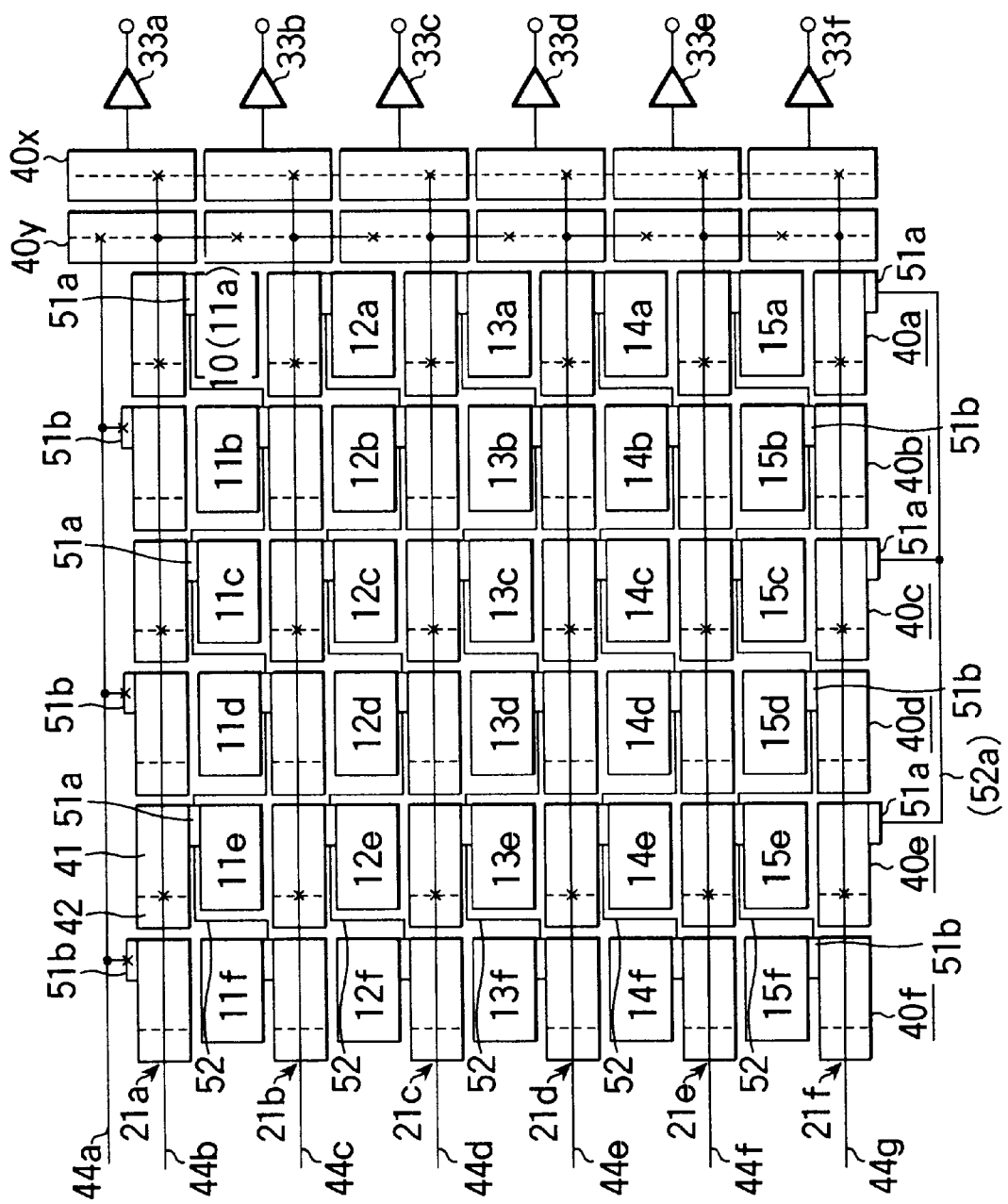
FIG. 3 is a schematic plan view of the constitution of a major part of the solid-state image pickup device shown in FIGS. 2A to 2C to explain a method for driving the device.

FIG. 3 shows the constitution of the main part of the device more diagramatically in order to explain the method of driving the solid-state image pickup device shown in FIG. 2. Assume that, in this constitution, the number of rows is five and the number of columns is six.

As described above, the horizontal transfer sections 21a to 21f are arranged adjacent to the light-receiving regions 10 (light-receiving sections of the first row 11a to 11f, those of the second row 12a to 12f, those of the third row 13a to 13f, those of the fourth row 14a to 14f, and those of the fifth row 15a to 15f). Each of the horizontal transfer sections 21a to 21f is constituted of a plurality of transfer electrodes 40a to 40f which correspond to their respective light-receiving regions 10 and each of which includes storage electrodes 41 and barrier electrodes 42, in such a manner that they can be operated by two-phase driving. Out of the transfer electrodes 40a to 40f, signal charge reading sections 51a are provided between the odd-numbered transfer electrodes (first storage electrodes) 40a, 40c and 40e and their corresponding light-receiving sections 11a, 11c and 11e, 12a, 12c and 12e, 13a, 12c and 13e, 14a, 14c and 14e, and 15a, 15c and 15e, and signal charge reading sections 51b are provided between the even-numbered transfer electrodes (second storage electrodes) 40b, 40d and 40f and their corresponding light-receiving sections 11b, 11d and 11f, 12b, 12d and 12f, 13b, 12d and 13f, 14b, 14d and 14f, and 15b, 15d and 15f.

The reading sections 51a corresponding to the transfer electrodes 40a, 40c and 40e of the horizontal transfer section 21a are electrically connected to the reading sections 51b corresponding to the transfer electrodes 40b, 40d and 40f of the horizontal transfer section 21b by means of wires 52, respectively.

Similarly, the reading sections 51a corresponding to the transfer electrodes 40a, 40c and 40e of the horizontal transfer section 21b are electrically connected to the reading sections 51b corresponding to the transfer electrodes 40b, 40d and 40f of the horizontal transfer section 21c by means of wires 52, respectively.

Similarly, the reading sections 51a corresponding to the transfer electrodes 40a, 40c and 40e of the horizontal transfer section 21c are electrically connected to the reading sections 51b corresponding to the transfer electrodes 40b, 40d and 40f of the horizontal transfer section 21d by means of wires 52, respectively.

Similarly, the reading sections 51a corresponding to the transfer electrodes 40a, 40c and 40e of the horizontal transfer section 21d are electrically connected to the reading sections 51b corresponding to the transfer electrodes 40b, 40d and 40f of the horizontal transfer section 21e by means of wires 52, respectively.

Similarly, the reading sections 51a corresponding to the transfer electrodes 40a, 40c and 40e of the horizontal transfer section 21e are electrically connected to the reading sections 51b corresponding to the transfer electrodes 40b, 40d and 40f of the horizontal transfer section 21f by means of wires 52, respectively.

The reading sections 51a corresponding to the odd-numbered transfer electrodes 40a, 40c and 40e of the horizontal transfer section 21f are electrically connected to one another by means of wiring 52a.

The reading sections 51b corresponding to the even-numbered transfer electrodes 40b, 40d and 40f of the horizontal transfer section 21a are electrically connected to one another by means of driving wire 44a. A driving pulse is applied to each of the transfer electrodes through the driving wire 44a. The driving pulses, which are applied to the transfer electrodes 40b, 40d and 40f of the horizontal transfer section 21a, are also applied to a transfer electrode 40y provided at one end of the row between the horizontal transfer section 21a and signal charge detecting section 33a.

On the other hand, the driving pulses are applied to the odd-numbered transfer electrodes 40a, 40c and 40e of the horizontal transfer section 21a through driving wire 44b. Thus, the driving pulses are also applied to the even-numbered transfer electrodes 40b, 40d and 40f of the horizontal transfer section 21b through the wiring 52. Furthermore, the driving pulses, which are applied to the transfer electrodes 40a, 40c and 40e of the horizontal transfer section 21a and the transfer electrodes 40b, 40d and 40f of the horizontal transfer section 21b, are also applied to a transfer electrode 40x provided at one end of the row between the horizontal transfer section 21a and signal charge detecting section 33a and a transfer electrode 40y provided at one end of the row between the horizontal transfer section 21b and signal charge detecting section 33b.

Similarly, the driving pulses are applied to the odd-numbered transfer electrodes 40a, 40c and 40e of the horizontal transfer section 21b through driving wire 44c. Thus, the driving pulses are also applied to the even-numbered transfer electrodes 40b, 40d and 40f of the horizontal transfer section 21c through the wiring 52. Furthermore, the driving pulses, which are applied to the transfer electrodes 40a, 40c and 40e of the horizontal transfer section 21b and the transfer electrodes 40b, 40d and 40f of the horizontal transfer section 21c, are also applied to a transfer electrode 40x provided at one end of the row between the horizontal transfer section 21b and signal charge detecting section 33b and a transfer electrode 40y provided at one end of the row between the horizontal transfer section 21c and signal charge detecting section 33c.

Similarly, the driving pulses are applied to the odd-numbered transfer electrodes 40a, 40c and 40e of the horizontal transfer section 21c through driving wire 44d. Thus, the driving pulses are also applied to the even-numbered transfer electrodes 40b, 40d and 40f of the horizontal transfer section 21d through the wiring 52. Furthermore, the driving pulses, which are applied to the transfer electrodes 40a, 40c and 40e of the horizontal transfer section 21c and the transfer electrodes 40b, 40d and 40f of the horizontal transfer section 21d, are also applied to a transfer electrode 40x provided at one end of the row between the horizontal transfer section 21c and signal charge detecting section 33c and a transfer electrode 40y provided at one end of the row between the horizontal transfer section 21d and signal charge detecting section 33d.

Similarly, the driving pulses are applied to the odd-numbered transfer electrodes 40a, 40c and 40e of the horizontal transfer section 21d through driving wire 44e. Thus, the driving pulses are also applied to the even-numbered transfer electrodes 40b, 40d and 40f of the horizontal transfer section 21e through the wiring 52. Furthermore, the driving pulses, which are applied to the transfer electrodes 40a, 40c and 40e of the horizontal transfer section 21d and the transfer electrodes 40b, 40d and 40f of the horizontal transfer section 21e, are also applied to a transfer electrode 40x provided at one end of the row between the horizontal transfer section 21d and signal charge detecting section 33d and a transfer electrode 40y provided at one end of the row between the horizontal transfer section 21e and signal charge detecting section 33e.

Similarly, the driving pulses are applied to the odd-numbered transfer electrodes 40a, 40c and 40e of the horizontal transfer section 21e through driving wire 44f. Thus, the driving pulses are also applied to the even-numbered transfer electrodes 40b, 40d and 40f of the horizontal transfer section 21f through the wiring 52. Furthermore, the driving pulses, which are applied to the transfer electrodes 40a, 40c and 40e of the horizontal transfer section 21e and the transfer electrodes 40b, 40d and 40f of the horizontal transfer section 21d, are also applied to a transfer electrode 40x provided at one end of the row between the horizontal transfer section 21e and signal charge detecting section 33e and a transfer electrode 40y provided at one end of the row between the horizontal transfer section 21f and signal charge detecting section 33f.

The driving pulses are applied to the odd-numbered transfer electrodes 40a, 40c and 40e of the horizontal transfer section 21f and a transfer electrode 40x provided at one end of the row between the horizontal transfer section 21f and signal charge detecting section 33f through a driving wire 44g. In particular, when the reading sections 51a, which correspond to the odd-numbered transfer electrodes 40a, 40c and 40e of the horizontal transfer section 21f, are electrically connected to each other by means of wire 52a, the driving pulses can be applied to all of the transfer electrodes 40a, 40c and 40e if a driving pulse is applied to any one of these transfer electrodes.

Figure 4:
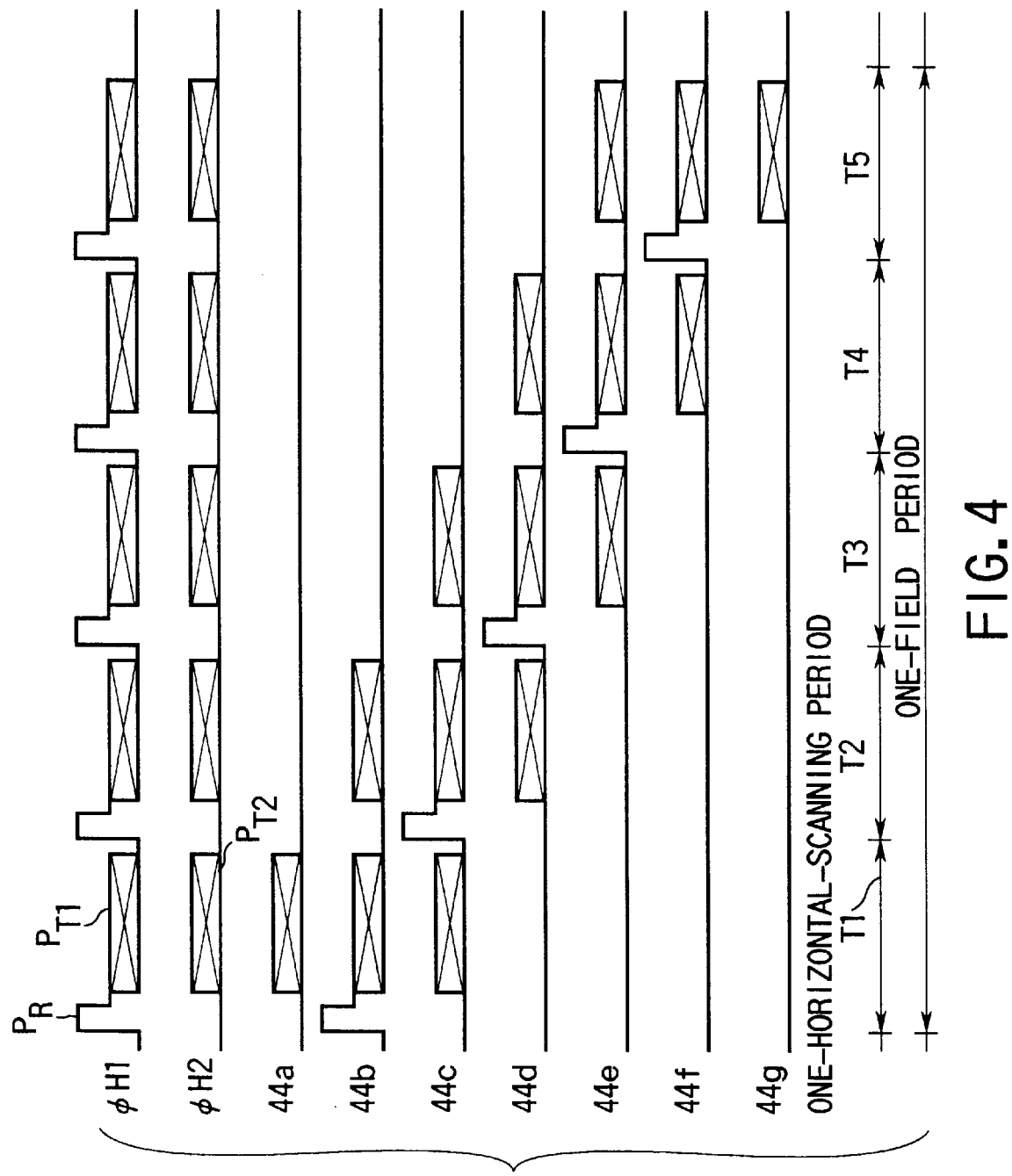
FIG. 4 is a signal waveform chart showing an example of driving pulses for driving the solid-state image pickup device of FIG. 3.

FIG. 4 shows an example of driving pulses for driving the solid-state image pickup device of FIG. 3. In this example, the signal charges of light-receiving sections 11a to 11f are read out, transferred and output in the following order: the first row, second row, . . . , and the fifth row.

A driving pulse φH1 includes a signal charge readout driving pulse $P_R$ for reading out signal charges stored in the light-receiving regions 10 within a one-horizontal-scanning time period T and a charge transfer driving pulse $P_{T1}$ for transferring the read-out signal charges in the horizontal direction. A driving pulse φH2 includes a charge transfer driving pulse $P_{T2}$ for transferring signal charges in the horizontal direction within a one-horizontal-scanning period. Since the driving pulses $P_{T1}$ and $P_{T2}$ are used for two-phase driving, their phases are opposite to each other.

In order to output the signal charges of light-receiving sections 11a to 11f corresponding to the first row, the driving pulse φH1 is applied to the driving wire 44b and the driving pulse φH2 is applied to the driving wires 44a and 44c during a time period T1. If the driving pulse $P_R$ is applied to the driving wire 44b, the signal charges are read out of the light-receiving sections 11a to 11f in that timing and supplied to the transfer channels 2 corresponding to the transfer electrodes 40a, 40c and 40e of the horizontal transfer section 21a and the transfer electrodes 40b, 40d and 40f of the horizontal transfer section 21b. In other words, the transfer electrodes 40a, 40c and 40e of the horizontal transfer section 21a are connected to the transfer electrodes 40b, 40d and 40f of the horizontal transfer section 21b. Thus, the signal charges 11a', 11c' and 11e' of the odd-numbered light-receiving sections 11a, 11c and 11e are read out by the horizontal transfer section 21a, and the signal charges 11b', 11d' and 11f' of the even-numbered light-receiving sections 11b, 11d and 11f are read out by the horizontal transfer section 21b.

If the charge transfer driving pulses $P_{T1}$ and $P_{T2}$ are then applied to the driving wires 44a, 44b and 44c, the readout signal charges 11a', 11c' and 11e' and the readout signal charges 11b', 11d' and 11f' are transferred in sequence to the signal charge detecting sections 33a and 33b, respectively. The signal charges 11a', 11c' and 11e' transferred by the horizontal transfer section 21a and the signal charges 11b', 11d' and 11f' transferred by the horizontal transfer section 21b are shifted only by ½ transfer stage at the time when they are read out, with the result that the signal charge detection timing of the signal charge detecting sections 33a and 33b is shifted by half the time required for transferring the signal charges by one stage. The signal charge detecting sections 33a and 33b are selected by the frequency which is two times higher than the driving pulses $P_{T1}$ and $P_{T2}$, and connected to the output section 35 alternately. Thus, the signal charges of light-receiving sections 11a to 11f in the first row can be output in time sequence in the following order: 11a', 11b', 11c', 11d', 11e' and 11f'.

Assume that the driving pulse φH1 is applied to the driving wire 44c and the driving pulse φH2 is applied to the driving wires 44b and 44d during a time period T2. Out of the signal charges of light-receiving sections 12a to 12f in the second row, those of light-receiving sections 12a, 12c and 12e are read out by the horizontal transfer section 21b and, those of light-receiving sections 12b, 12d and 12f are read out by the horizontal transfer section 21c. The signal charges of light-receiving sections 12a to 12f in the second row, which are read out by the horizontal transfer sections 21b and 21c, are transferred to the signal charge detecting sections 33b and 33c and then output in time sequence from the output section 35.

Similarly, assume that the driving pulse φH1 is applied to the driving wire 44d and the driving pulse φH2 is applied to the driving wires 44c and 44e during a time period T3. Out of the signal charges of light-receiving sections 13a to 13f in the third row, those of light-receiving sections 13a, 13c and 13e are read out by the horizontal transfer section 21c, and those of light-receiving sections 13b, 13d and 13f are read out by the horizontal transfer section 21d. The signal charges of light-receiving sections 13a to 13f in the third row, which are read out by the horizontal transfer sections 21c and 21d, are transferred to the signal charge detecting sections 33c and 33d and then output in time sequence from the output section 35.

Similarly, assume that the driving pulse φH1 is applied to the driving wire 44e and the driving pulse φH2 is applied to the driving wires 44d and 44f during a time period T4. Out of the signal charges of light-receiving sections 14a to 14f in the fourth row, those of light-receiving sections 14a, 14c and 14e are read out by the horizontal transfer section 21d, and those of light-receiving sections 14b, 14d and 14f are read out by the horizontal transfer section 21e. The signal charges of light-receiving sections 14a to 14f in the fourth row, which are read out by the horizontal transfer sections 21d and 21e, are transferred to the signal charge detecting sections 33d and 33e and then output in time sequence from the output section 35.

Similarly, assume that the driving pulse φH1 is applied to the driving wire 44f and the driving pulse φH2 is applied to the driving wires 44e and 44g during a time period T5. Out of the signal charges of light-receiving sections 15a to 15f in the fifth row, those of light-receiving sections 15a, 15c and 15e are read out by the horizontal transfer section 21e, and those of light-receiving sections 15b, 15d and 15f are read out by the horizontal transfer section 21f. The signal charges of light-receiving sections 15a to 15f in the fifth row, which are read out by the horizontal transfer sections 21e and 21f, are transferred to the signal charge detecting sections 33e and 33f and then output in time sequence from the output section 35.

As described above, the signal charges of odd-numbered light-receiving sections and those of even-numbered light-receiving sections in each of the rows are read out in sequence by means of a pair of horizontal transfer sections during a time period of one field. Thus, the progressive scanning drive system for outputting the signal charges of all the light-receiving regions 10 in time sequence, can be achieved.

It is needless to say that various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image pickup device comprising:
    a plurality of light-receiving sections arranged in a matrix on a semiconductor substrate;
    a plurality of signal charge transfer sections each including a pair of first and second horizontal transfer sections and corresponding to the light-receiving sections in a row direction, the second horizontal transfer section of one of any two adjacent signal charge transfer sections doubling as the first horizontal transfer section of the other signal charge transfer section, the first horizontal transfer section being used to transfer signal charges of odd light receiving sections arranged in one of a corresponding row, and the second horizontal transfer section being used to transfer signal charges of even light receiving sections arranged in one of the corresponding rows;
    a driving section for driving each of the pairs of horizontal transfer sections of the signal charge transfer sections and selectively transferring signal charges of the light-receiving sections in the row direction by the horizontal transfer sections; and
    an output section for time-sequentially outputting the signal charges of the light-receiving sections in the row direction, which are transferred by the horizontal transfer sections.

2. The solid-state image pickup device according to claim 1, wherein the pair of horizontal transfer sections of the signal charge transfer sections includes first storage electrodes and second storage electrodes which are arranged alternately.

3. The solid-state image pickup device according to claim 1, wherein the pair of horizontal transfer sections of the signal charge transfer sections includes first storage electrodes corresponding to the odd-numbered light-receiving section and second storage electrodes corresponding to the even-numbered light-receiving sections, the first storage electrodes and the second storage electrodes being arranged alternately.

4. The solid-state image pickup device according to claim 3, wherein one of the horizontal transfer sections of the signal charge transfer sections transfers signal charges of odd-numbered light-receiving sections corresponding to the first storage electrodes, and other horizontal transfer section transfers signal charges of even-numbered light-receiving sections corresponding to the second storage electrodes.

5. The solid-state image pickup device according to claim 4, wherein the first storage electrodes and the second storage electrodes are connected to each other.

6. The solid-state image pickup device according to claim 5, wherein different driving wires are connected to the first storage electrodes and the second storage electrodes.

7. The solid-state image pickup device according to claim 4, wherein the first storage electrodes and the second storage electrodes are electrically connected to each other.

8. The solid-state image pickup device according to claim 7, wherein a common driving wire is connected to the first storage electrodes and another common driving wire is connected to the second storage electrodes.

9. The solid-state image pickup device according to claim 1, wherein the pairs of horizontal transfer sections of the signal charge transfer sections have output stages each provided with a MOS switch.

10. The solid-state image pickup device according to claim 9, wherein the MOS switch is turned on and turned off alternately at a frequency which is twice as high as that of a driving pulse for transferring the charges.

* * * * *